United States Patent [19]
Horigome

[11] Patent Number: 5,303,410
[45] Date of Patent: Apr. 12, 1994

[54] SIGNAL STRENGTH METER CIRCUIT FOR RADIO RECEIVER

[75] Inventor: Fumihiko Horigome, Saitama, Japan

[73] Assignee: Pioneer Electronic Corporation, Tokyo, Japan

[21] Appl. No.: 797,858

[22] Filed: Nov. 26, 1991

[30] Foreign Application Priority Data

Jun. 21, 1991 [JP] Japan .................. 3-55667

[51] Int. Cl.$^5$ ............................. H04B 17/00
[52] U.S. Cl. .............................. 455/226.4; 455/155.1
[58] Field of Search ............. 455/154.1, 154.2, 155.1, 455/219, 221, 226.1, 226.2, 226.4, 232.1, 234.1

[56] References Cited

U.S. PATENT DOCUMENTS

| | | | |
|---|---|---|---|
| 3,881,155 | 4/1975 | Saikaishi | 455/226.4 |
| 4,186,351 | 1/1980 | Brefini et al. | 455/226.4 |
| 4,360,928 | 11/1982 | Campbell | 455/226.4 |
| 4,578,820 | 3/1986 | Highton | 455/226.4 |
| 4,580,287 | 4/1986 | Richards, Jr. | 455/226.4 |
| 4,619,002 | 10/1986 | Thro | 455/226.2 |

FOREIGN PATENT DOCUMENTS 0114933  7/1984  Japan .................. 455/226.4

Primary Examiner—Reinhard J. Eisenzopf
Assistant Examiner—Nguyen Vo
Attorney, Agent, or Firm—Nikaido, Marmelstein, Murray & Oram

[57] ABSTRACT

A tuner has an intermediate-frequency amplifier and an automatic gain control which are connected to form a loop. A detector is connected to an input side of the intermediate-frequency amplifier so as to be applied with a signal to be applied to the intermediate-frequency amplifier. A logarithmic amplifier is provided for producing an output for logarithmic display on a signal meter.

4 Claims, 2 Drawing Sheets

SIGNAL STRENGTH METER CIRCUIT FOR RADIO RECEIVER

BACKGROUND OF THE INVENTION

The present invention relates to a signal meter circuit for an automatic tuner of a radio receiver.

FIG. 4 shows a conventional AM tuner having a signal meter circuit. An output of an AM front end 2 connected to an antenna 1 is connected to an intermediate-frequency amplifier 3. The output of the intermediate-frequency amplifier 3 is demodulated by a detector 4, which is outputted from an output terminal 9. An automatic gain control (AGC) 7 is provided between the output of the detector 4 and the intermediate-frequency amplifier 3 through one of low pass filters 5 and 6, which are alternatively selected by a switch 8. The low pass filters are provided for producing direct current components from the output of the detector 4. A signal meter 10 is connected to the output of the intermediate-frequency amplifier 3 in the loop of the AGC 7.

Namely, the output signal to the signal meter 10 is controlled by the AGC 7 to an approximately constant level. Consequently, the output signal does not linearly change with respect to the level of received energy. In other words, the output signal does not change largely with the change of the electric field strength, which causes error in tuning operation.

On the other hand, the low pass filter 5 has a time constant $T_1$ having a longer time as several tens msec. for receiving waves for stabilizing the level of the output of the AGC loop. To the contrary, the low pass filter 6 has a shorter time constant $T_2$ as several msec. for scanning the frequency band for the tuning. As a result, the switch 8 must be provided for selecting one of the LPFs 5 and 6. Accordingly, the circuit becomes complicated in construction.

SUMMARY OF THE INVENTION

An object of the present invention is to provide a signal meter circuit which may exactly select a particular broadcast channel frequency.

Another object of the present invention is to provide a signal meter circuit without the switch for selecting the LPF.

According to the present invention there is provided a signal meter circuit connected to a tuner having an intermediate-frequency amplifier and an automatic gain control (AGC) which are connected to form an AGC loop.

The signal meter circuit has a detector connected to the tuner so as to be applied with a signal which is to be applied to the intermediate-frequency amplifier, and a logarithmic amplifier provided for producing an output for logarithmic display on a signal meter.

In an aspect of the invention, a low pass filter is provided for producing a direct component from the output of the detector, and an amplifier is provided for amplifying the signal to be applied to the detector. The low pass filter is connected to an output of the detector and the logarithmic amplifier is connected to an output of the low pass filter.

Thus, the signal applied to the signal meter circuit is obtained from the outside of the AGC loop at the input side of the intermediate-frequency amplifier. Therefore, the signal is not influenced by the automatic gain control.

The other objects and features of this invention will become understood from the following description with reference to the accompanying drawings.

DETAILED DESCRIPTION OF THE PREFERRED EMBODIMENTS

Figure 1:
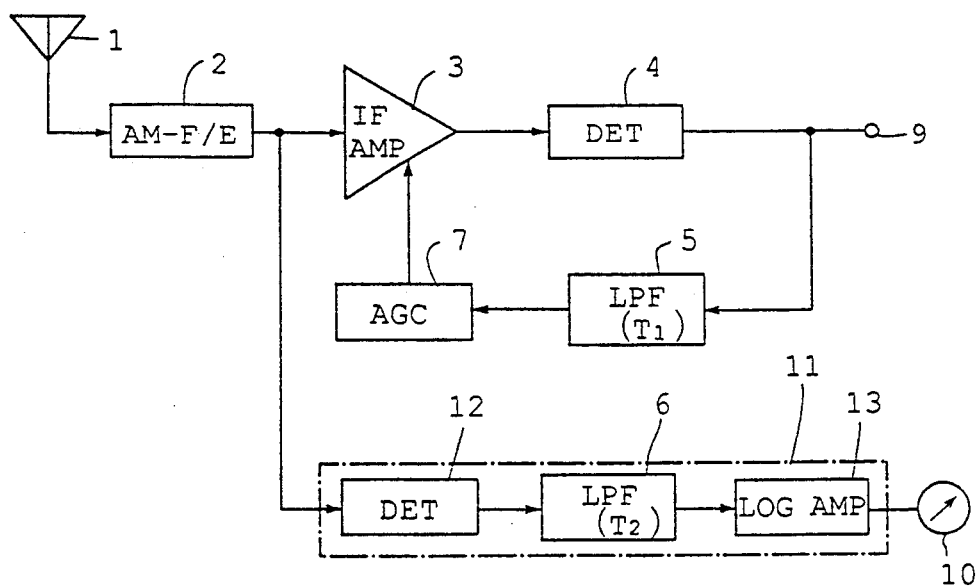
FIG. 1 is an AM tuner having a signal meter circuit of the present invention.

Referring to FIG. 1, the AM tuning circuit has a AGC loop connected to the AM front end 2, comprising the intermediate-frequency (IF) amplifier 3. The detector 4, the low pass filter 5 having the longer time constant $T_1$, and the automatic gain control 7.

A signal meter circuit 11 is connected to the input side of the intermediate-frequency amplifier 3. The signal meter circuit 11 comprises a detector 12 connected to the input side of the intermediate-frequency amplifier, the low pass filter 6 having the short time constant $T_2$ and connected to the detector 12, and a logarithmic amplifier 13 connected to the low pass filter 6 to produce an output to the signal meter 10 for logarithmic display on the meter.

The signal applied to the signal meter circuit 11 is obtained from the outside of the AGC loop at the input side of the IF amplifier 3, so that the signal is not influenced by the automatic gain control 7. Thus, exact tuning can be obtained. Further, since both the low pass filters 5 and 6 are separated in respective circuits, there is not provided a switch for selecting the low pass filter.

Figure 2:
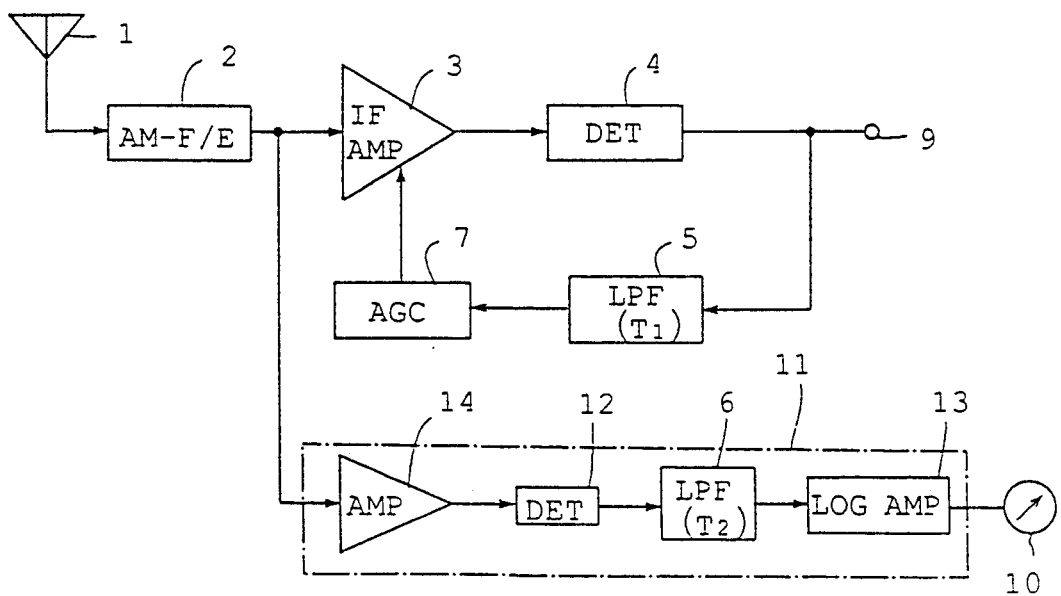
FIGS. 2 and 3 show a second embodiment and a third embodiment of the present invention.

Referring to FIG. 2 showing the second embodiment, an amplifier 14 is provided at the input side of the detector 12 for ensuring the demodulation operation of the detector 12.

Figure 3:
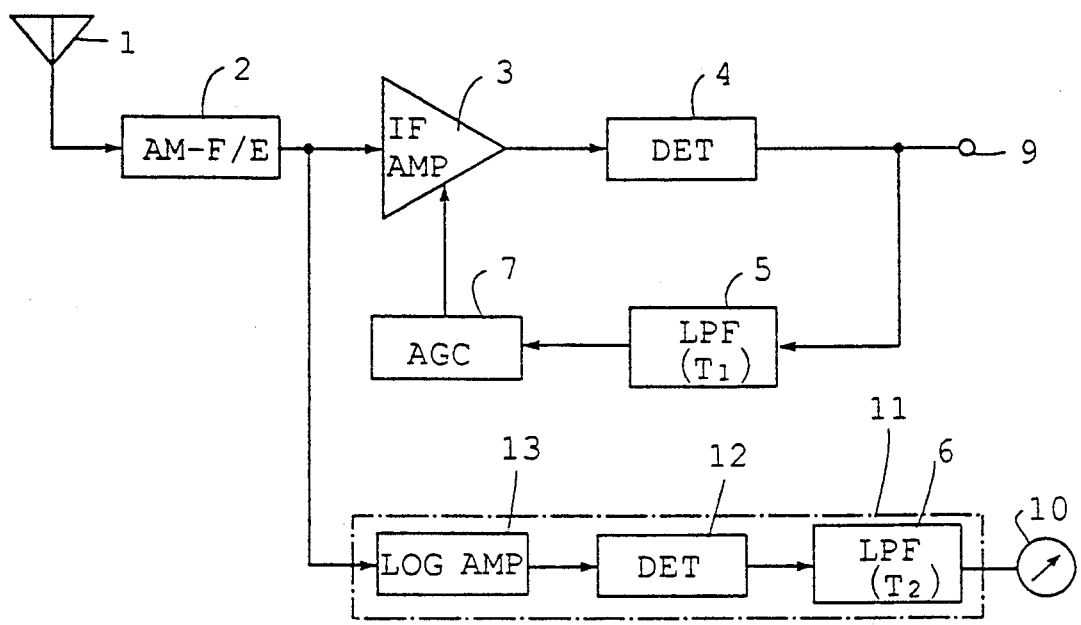
Figure 4:
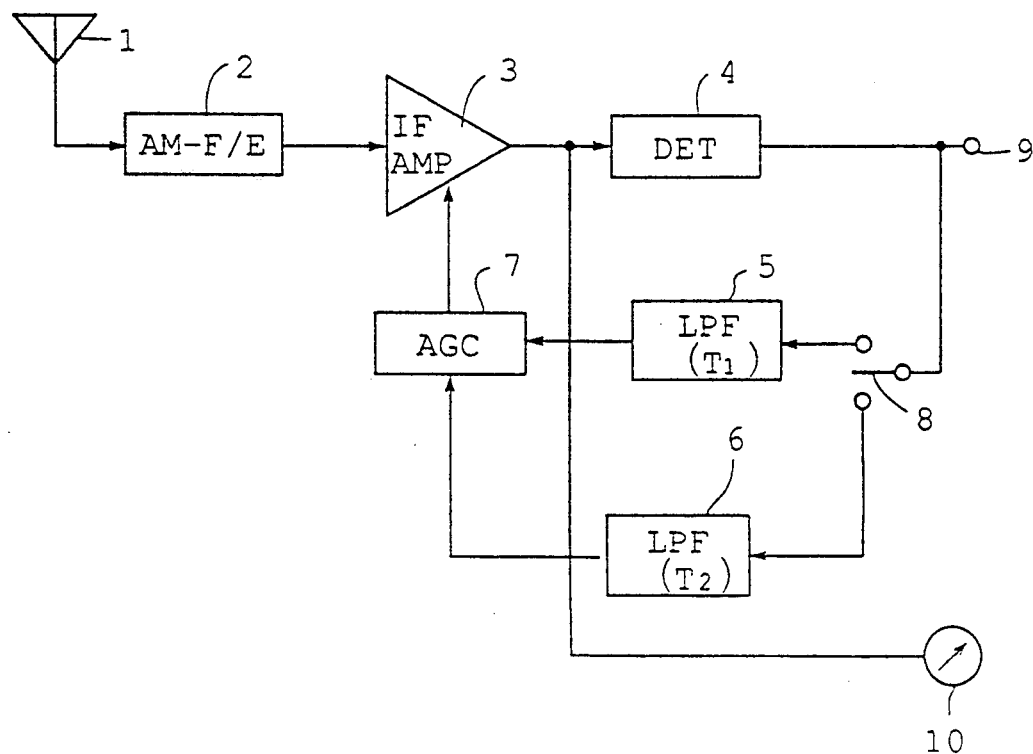
FIG. 4 is a conventional AM tuner circuit.

In the circuit of the third embodiment shown in FIG. 3, the detector 12 and the logarithmic amplifier 13 are arranged in the reverse order of that of the previous embodiment. The effect of the circuit is the same as the previous embodiments.

From the foregoing it will be understood that the present invention provides a signal meter circuit which exactly selects a desired frequency, and is simplified in construction.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A signal strength meter circuit connected to a tuner having an intermediate-frequency amplifier and an automatic gain control loop including a first detector connected to an output of the intermediate-frequency amplifier, a first low pass filter having a first time constant and connected to an output of the first detector, and an automatic gain control provided between an output of the first low pass filter and an input of the intermediate-frequency amplifier, comprising:

a second detector connected to the tuner so as to be applied with a signal which is to be applied to the intermediate-frequency amplifier;

a second low pass filter having a second time constant shorter than the first time constant and connected to an output of the second detector so that the signal is converted into pulses;

a logarithmic amplifier provided between an output of the second low pass filter and a signal meter, such that the signal meter circuit produces an output for logarithmic display on the signal meter.

2. A signal strength meter circuit according to claim 1, further comprising an amplifier for amplifying the signal to be applied to the second detector.

3. A signal strength meter circuit according to claim 2, wherein the second low pass filter is connected to the output of the second detector and the logarithmic amplifier is provided between the output of the second low pass filter and the signal meter.

4. A signal strength meter circuit connected to a tuner having an intermediate-frequency amplifier and an automatic gain control loop including a first detector connected to an output of the intermediate-frequency amplifier, a first low pass filter having a first time constant and connected to an output of the first detector, and an automatic gain control provided between an output of the first low pass filter and an input of the intermediate-frequency amplifier, comprising:

a second detector connected to the tuner so as to be applied with a signal which is to be applied to the intermediate-frequency amplifier;

a second low pass filter having a second time constant shorter than the first time constant and connected to an output of the second detector so that the signal is converted into pulses;

a logarithmic amplifier provided before an input of the second detector, such that the signal meter circuit produces an output for logarithmic display on a signal meter which is connected to an output of the second low pass filter.

* * * * *